(12) United States Patent
Yashima et al.

(10) Patent No.: US 9,006,691 B2
(45) Date of Patent: Apr. 14, 2015

(54) CHARGED PARTICLE BEAM WRITING APPARATUS AND CHARGED PARTICLE BEAM WRITING METHOD USING A GENERATED FRAME THAT SURROUNDS A FIRST DATA PROCESSING BLOCK

(75) Inventors: Jun Yashima, Kanagawa (JP); Akihito Anpo, Tokyo (JP)

(73) Assignee: NuFlare Technolgy, Inc., Numazu-shi (JP)

(*) Notice: Subject to any disclaimer, the term of this patent is extended or adjusted under 35 U.S.C. 154(b) by 19 days.

(21) Appl. No.: 13/465,221

(22) Filed: May 7, 2012

(65) Prior Publication Data
US 2012/0292536 A1 Nov. 22, 2012

(30) Foreign Application Priority Data
May 20, 2011 (JP) ................................ 2011-113005

(51) Int. Cl.
*B82Y 10/00* (2011.01)
*H01J 37/304* (2006.01)
*H01J 37/317* (2006.01)
*B82Y 40/00* (2011.01)

(52) U.S. Cl.
CPC .............. *H01J 37/3174* (2013.01); *B82Y 10/00* (2013.01); *B82Y 40/00* (2013.01); *H01J 2237/31776* (2013.01); *H01J 2237/304* (2013.01); *H01J 2237/31762* (2013.01); *H01J 2237/31764* (2013.01)

(58) Field of Classification Search
CPC ................... H01J 37/3026; H01J 2237/31764; H01J 2237/30461; H01J 2237/31762
USPC .............................. 250/492.1, 492.22, 492.23
See application file for complete search history.

(56) References Cited

U.S. PATENT DOCUMENTS

| 5,313,068 | A | * | 5/1994 | Meiri et al. ............... 250/492.22 |
| 5,754,443 | A | * | 5/1998 | Manabe ........................... 716/53 |
| 5,847,959 | A | * | 12/1998 | Veneklasen et al. .......... 700/121 |
| 5,870,312 | A | * | 2/1999 | Scepanovic et al. .......... 716/122 |

(Continued)

FOREIGN PATENT DOCUMENTS

| JP | 2008-218767 | 9/2008 |
| JP | 2009-64862 | 3/2009 |
| JP | 2010-267844 | 11/2010 |

OTHER PUBLICATIONS

U.S. Appl. No. 13/765,140, filed Feb. 12, 2013, Kato, et al.

(Continued)

*Primary Examiner* — Brooke Purinton
(74) *Attorney, Agent, or Firm* — Oblon, McClelland, Maier & Neustadt, L.L.P.

(57) ABSTRACT

A charged particle beam writing apparatus includes a unit to divide a chip region into first data processing blocks, a unit to, in each block, extract a cell whose reference position is located in the block concerned from cells each including at least one figure pattern, a unit to, for each block, generate a first frame that surrounds the block concerned and the cell extracted, a unit to, for each first frame, divide the inside of the first frame concerned into mesh regions and calculate an area density of a figure pattern in each mesh, a unit to combine area densities of mesh regions which are overlapped with each other and between different first frames, a unit to calculate a dose of beam by using the area density, and a unit to write a pattern on a target workpiece by irradiating the beam of the dose calculated.

19 Claims, 10 Drawing Sheets

(56) References Cited

U.S. PATENT DOCUMENTS

| | | | |
|---|---|---|---|
| 6,145,118 A * | 11/2000 | Tomita | 250/492.22 |
| 6,415,432 B1 * | 7/2002 | Saito et al. | 716/55 |
| 6,484,300 B1 * | 11/2002 | Kim et al. | 716/51 |
| 6,759,666 B2 * | 7/2004 | Nagata et al. | 250/492.22 |
| 6,828,573 B1 * | 12/2004 | Kawano et al. | 250/492.23 |
| 7,174,526 B2 * | 2/2007 | Shrowty et al. | 716/112 |
| 7,592,611 B2 * | 9/2009 | Kasahara et al. | 250/492.22 |
| 2007/0281490 A1 * | 12/2007 | Inanami | 438/712 |
| 2008/0116398 A1 * | 5/2008 | Hara et al. | 250/492.22 |
| 2008/0203324 A1 * | 8/2008 | Fujimura et al. | 250/492.23 |
| 2011/0068281 A1 * | 3/2011 | Hara et al. | 250/492.22 |
| 2012/0068089 A1 * | 3/2012 | Nakayamada et al. | 250/492.22 |

OTHER PUBLICATIONS

Office Action issued on Jan. 27, 2014 in the corresponding Korean Patent Application No. 10-2012-0053093 (with English Translation).
Office Action issued Jan. 20, 2015 to Japanese Patent Application No. 2011-113005, with English translation.

* cited by examiner

CHARGED PARTICLE BEAM WRITING APPARATUS AND CHARGED PARTICLE BEAM WRITING METHOD USING A GENERATED FRAME THAT SURROUNDS A FIRST DATA PROCESSING BLOCK

CROSS-REFERENCE TO RELATED APPLICATION

This application is based upon and claims the benefit of priority from the prior Japanese Patent Application No. 2011-113005 filed on May 20, 2011 in Japan, the entire contents of which are incorporated herein by reference.

BACKGROUND OF THE INVENTION

Field of the Invention

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Thus, the electron beam writing technique, which intrinsically has excellent resolution, is used for producing such a highly precise master pattern.

FIG. 14 is a schematic diagram explaining operations of a variable-shaped electron beam (EB) writing apparatus. As shown in the figure, the variable-shaped electron beam writing apparatus operates as described below. A first aperture plate 410 has a quadrangular opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 420, and thereby to irradiate a target workpiece or "sample" 340 placed on a stage which continuously moves in one predetermined direction (e.g. X direction) during the writing. In other words, a quadrangular shape that can pass through both the opening 411 and the variable-shape opening 421 is used for pattern writing in a writing region of the target workpiece 340 on the stage continuously moving in the X direction. This method of forming a given shape by letting beams pass through both the opening 411 of the first aperture plate 410 and the variable-shape opening 421 of the second aperture plate 420 is referred to as a variable shaped beam (VSB) method.

In a writing apparatus, a writing region is divided into strip-shaped stripe regions each having a fixed width. (Refer to, e.g., Japanese Patent Application Laid-Open (JP-A) No. 2010-267844). Then, by dividing the stripe region in the direction perpendicular to the direction of dividing the stripe region, each stripe region is divided into a plurality of data processing regions, and data processing is performed in each data processing region. In that case, a cell whose part is even slightly included in a data processing region is assigned to the data processing region concerned. Therefore, when a cell extends over a plurality of data processing regions, the same cell is respectively assigned to each of the plurality of data processing regions. Then, in each of the plurality of data processing regions, affiliation judgment processing is performed for a pattern in each assigned cell.

With the recent tendency to miniaturization and high density of patterns, the size of a data processing region tends to be smaller. On the other hand, the number of patterns tends to be larger. Therefore, the number of the same patterns for which the affiliation judgment processing is performed is also increasing in a plurality of data processing regions, and thereby the time for affiliation judgment processing for patterns in data processing regions also increases. Accordingly, there is a problem that such a time for affiliation judgment processing delays the calculation time of calculating a pattern area density, etc. in a data processing region. As a result, there is a problem that the writing time increases.

BRIEF SUMMARY OF THE INVENTION

In accordance with one aspect of the present invention, a charged particle beam writing apparatus includes a first dividing unit configured to divide a chip region into a plurality of first data processing blocks, a cell extracting unit configured to, in each of the plurality of first data processing blocks, extract a cell whose reference position is located in a first data processing block concerned from a plurality of cells each including at least one figure pattern, a first frame generating unit configured to, for each of the plurality of first data processing blocks, generate a first frame that surrounds the first data processing block concerned and the cell extracted, an area density calculating unit configured to, for each the first frame, divide an inside of the first frame concerned into a plurality of mesh regions, and calculate an area density of a figure pattern arranged in each of the plurality of mesh regions, an area density combining unit configured to combine an area density of one mesh region and an area density of another mesh region of the plurality of mesh regions, where the one and the another mesh regions are overlapped with each other and between different first frames, a dose calculating unit configured to calculate a dose of a charged particle beam by using the area density, and a writing unit configured to write a pattern on a target workpiece by irradiating the charged particle beam such that the charged particle beam has the dose calculated.

In accordance with another aspect of the present invention, a charged particle beam writing method includes dividing a chip region into a plurality of first data processing blocks, extracting, in each of the plurality of first data processing blocks, a cell whose reference position is located in a first data processing block concerned from a plurality of cells each including at least one figure pattern, generating, for each of the plurality of first data processing blocks, a first frame that surrounds the first data processing block concerned and the cell extracted, dividing, for each the first frame, an inside of the first frame concerned into a plurality of mesh regions, and calculating an area density of a figure pattern arranged in each of the plurality of mesh regions, combining an area density of one mesh region and an area density of another mesh region of the plurality of mesh regions, where the one and the another mesh regions are overlapped with each other and between different first frames, calculating a dose of a charged particle beam by using the area density, and writing a pattern on a target workpiece by irradiating the charged particle beam such that the charged particle beam has the dose calculated.

DETAILED DESCRIPTION OF THE INVENTION

In the following Embodiments, there will be described a structure in which an electron beam is used as an example of a charged particle beam. The charged particle beam is not limited to the electron beam, and other charged particle beam, such as an ion beam, may also be used. Moreover, a variable-shaped electron beam writing apparatus will be described as an example of a charged particle beam apparatus.

In the following Embodiments, there will be described a writing apparatus and method that can shorten the calculation time up to calculating a pattern area density in a data processing region.

Embodiment 1

Figure 1:
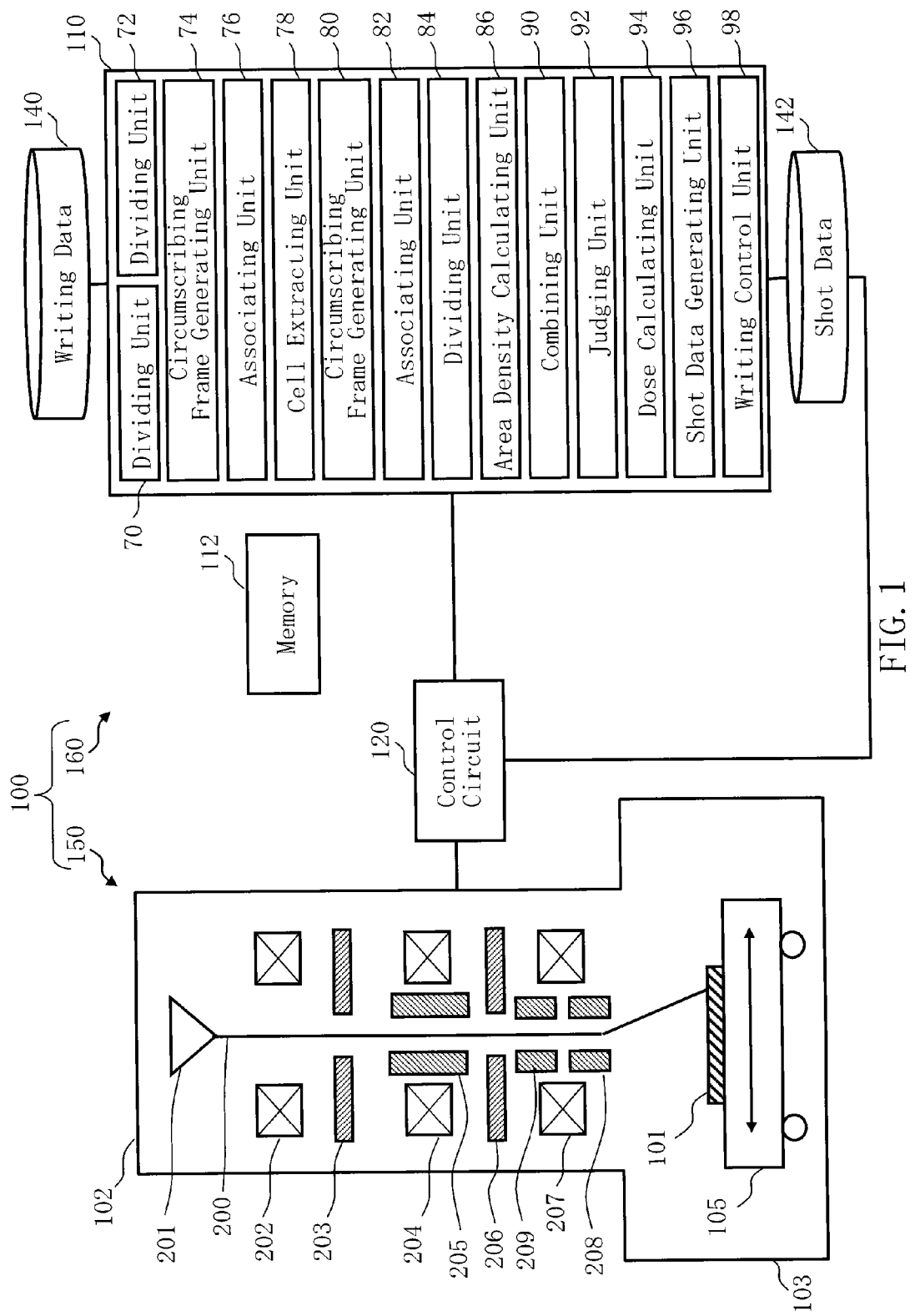
FIG. 1 is a schematic diagram showing a structure of a writing apparatus according to Embodiment 1.

FIG. 1 is a schematic diagram showing a structure of a writing or "drawing" apparatus according to Embodiment 1. In FIG. 1, a writing apparatus 100 includes a writing unit 150 and a controlling unit 160. The writing apparatus 100 is an example of a charged particle beam writing apparatus, and especially, an example of a variable-shaped electron beam writing apparatus. The writing unit 150 includes an electron lens barrel 102 and a writing chamber 103. In the electron lens barrel 102, there are arranged an electron gun 201, an illumination lens 202, a first aperture plate 203, a projection lens 204, a deflector 205, a second aperture plate 206, an objective lens 207, a main deflector 208, and a sub deflector 209. In the writing chamber 103, there is arranged an XY stage 105, on which a target workpiece 101, such as a mask, serving as a writing target is placed. The target workpiece 101 is, for example, a mask for exposure used for manufacturing semiconductor devices, or a mask blank on which resist has been coated and no pattern has yet been formed.

The controlling unit 160 includes a control computer 110, a memory 112, a control circuit 120, and storage devices 140 and 142, such as a magnetic disk drive. The control computer 110, the memory 112, the control circuit 120, and the storage devices 140 and 142 are mutually connected through a bus (not shown).

In the control computer unit 110, there are arranged dividing units 70 and 72, a circumscribing frame generating unit 74, an associating unit 76, a cell extracting unit 78, a circumscribing frame generating unit 80, an associating unit 82, a dividing unit 84, an area density calculating unit 86, a combining unit 90, a judging unit 92, a dose calculating unit 94, a shot data generating unit 96, and a writing control unit 98. Functions of the units described above may be configured by hardware such as an electronic circuit or by software such as a program executing these functions. Alternatively, they may be configured by a combination of hardware and software. Information input/output from/to the units described above and information being currently calculated are stored in the memory 112 each time.

As described above, FIG. 1 shows a structure necessary for explaining Embodiment 1. Other structure elements generally necessary for the writing apparatus 100 may also be included. For example, although a multiple stage deflector namely the two stage deflector of the main deflector 208 and the sub deflector 209 is herein used for deflecting a position, a single stage deflector or a multiple stage deflector of three or more stages may also be used to deflect the position.

Into the storage device 140 (storage unit), writing data of a chip which includes a plurality of cells each configured by at least one figure pattern is input from the outside the apparatus to be stored. In the writing data, arrangement coordinates and the size of each cell, and each figure pattern data indicating the shape, arrangement coordinates, size, etc. of each figure pattern in each cell are defined.

Figure 2:
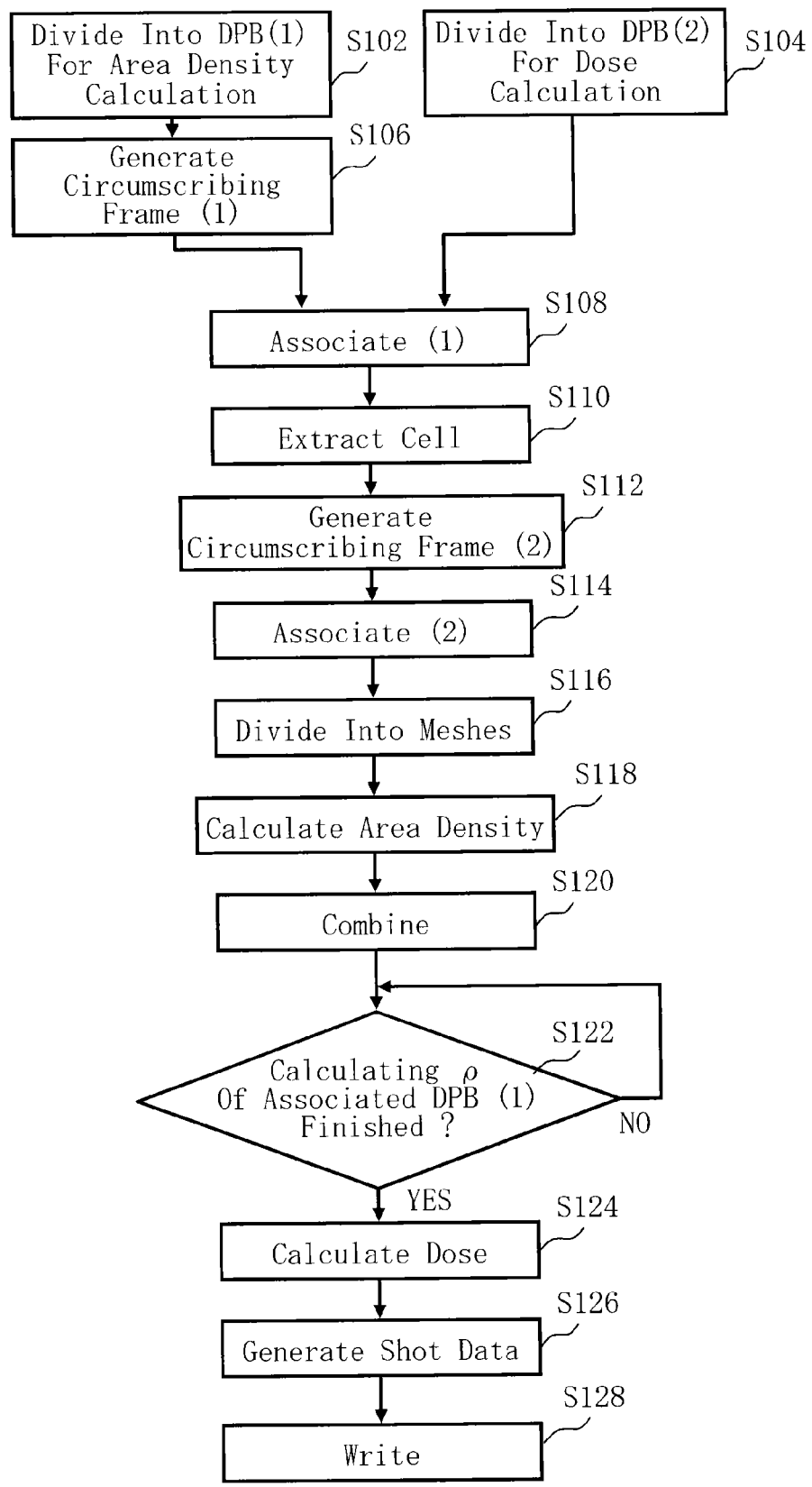
FIG. 2 is a flowchart showing main steps of a writing method according to Embodiment 1.

FIG. 2 is a flowchart showing main steps of a writing method according to Embodiment 1. As shown in FIG. 2, the writing method according to Embodiment 1 executes a series of steps: a step (S102) of dividing into data processing blocks (DPBs)(1), a step (S104) of dividing into DPBs (2), a circumscribing frame (1) generating step (S106), an associating (1) step (S108), a cell extracting step (S110), a circumscribing frame (2) generating step (S112), an associating (2) step (S114), a step (S116) of dividing into meshes, an area density calculating step (S118), a combining step (S120), a judging step (S122), a dose calculating step (S124), a shot data generating step (S126), and a writing step (S128).

Figures 3A, 3B:
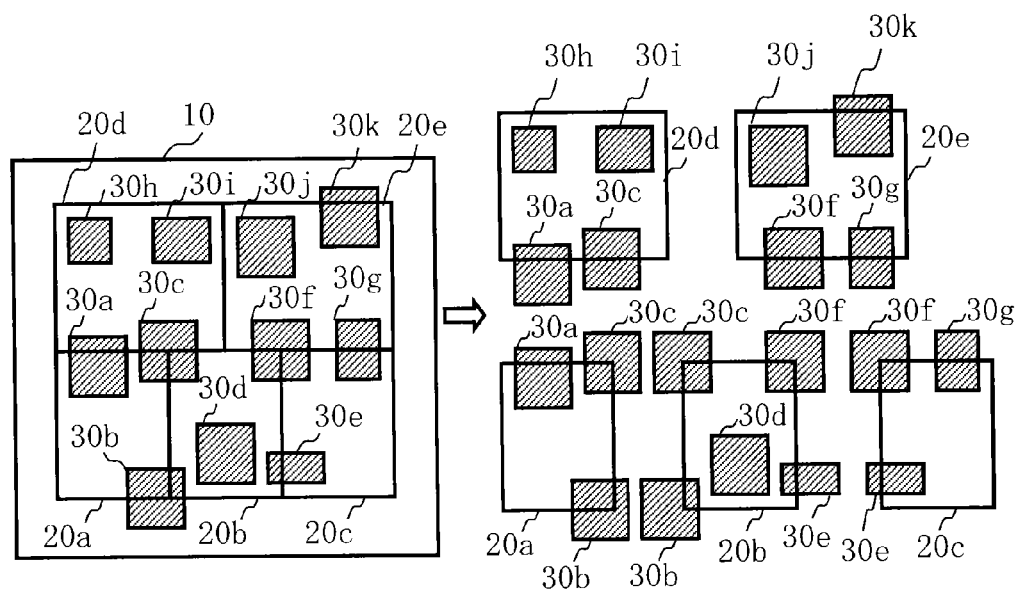
FIGS. 3A and 3B show, to be compared with Embodiment 1, an example of a data processing block in the case of extracting all the cells each of which extends over blocks.

FIGS. 3A and 3B show, to be compared with Embodiment 1, an example of a data processing block in the case of extracting all the cells each of which extends over blocks. FIG. 3A shows an example of dividing a certain chip region into a plurality of data processing blocks (DPBs) 20a to 20e. Cells 30a to 30k are arranged in the DPBs 20a to 20e. Specifically, in the DPB 20a, at least a part of each of the cells 30a, 30b, and 30c are included. In the DPB 20b, at least a part of each of the cells 30b, 30c, 30d, 30e, and 30f are included. In the DPB 20c, at least a part of each of the cells 30e, 30f, and 30g are included. In the DPB 20d, at least a part of each of the cells 30a, 30c, 30h, and 30i are included. In the DPB 20e, at least a part of each of the cells 30f, 30g, 30j, and 30k are included. Therefore, as shown in FIG. 3B, when extracting all the cells each of which extends over several blocks, affiliation judgment processing is performed as follows: In the DPB 20a, affiliation judgment processing is performed for figure patterns in the cells 30a, 30b and 30c to judge a figure pattern actually located in the DPB 20a. In the DPB 20b, affiliation judgment processing is performed for figure patterns in the cells 30b, 30c, 30d, 30e, and 30f to judge a figure pattern actually located in the DPB 20b. In the DPB 20c, affiliation judgment processing is performed for figure patterns in the cells 30e, 30f and 30g to judge a figure pattern actually located in the DPB 20c. In the DPB 20d, affiliation judgment processing is performed for figure patterns in the cells 30a, 30c, 30h and 30i to judge a figure pattern actually located in the DPB 20d. In the DPB 20e, affiliation judgment processing is performed for figure patterns in the cells 30f, 30g, 30j and 30k to judge a figure pattern actually located in the DPB 20e. For calculating an area density of each DPB, it is necessary to know figure patterns belonging to each DPB. Therefore, with respect to any cell included in a data processing block, even if only a part of the cell is included in a data processing block, affiliation judgment needs to be performed for the figure pattern in the cell. Accordingly, affiliation judgment processing is redundantly (in other words, a plurality of times) performed in a plurality of DPBs for the cells except for the cells 30d, 30h, 30i and 30j. Therefore, it takes a lot of time even to judge figure patterns in the cells. On the other hand, according to Embodiment 1, cells are extracted as described below.

Figures 4A, 4B:
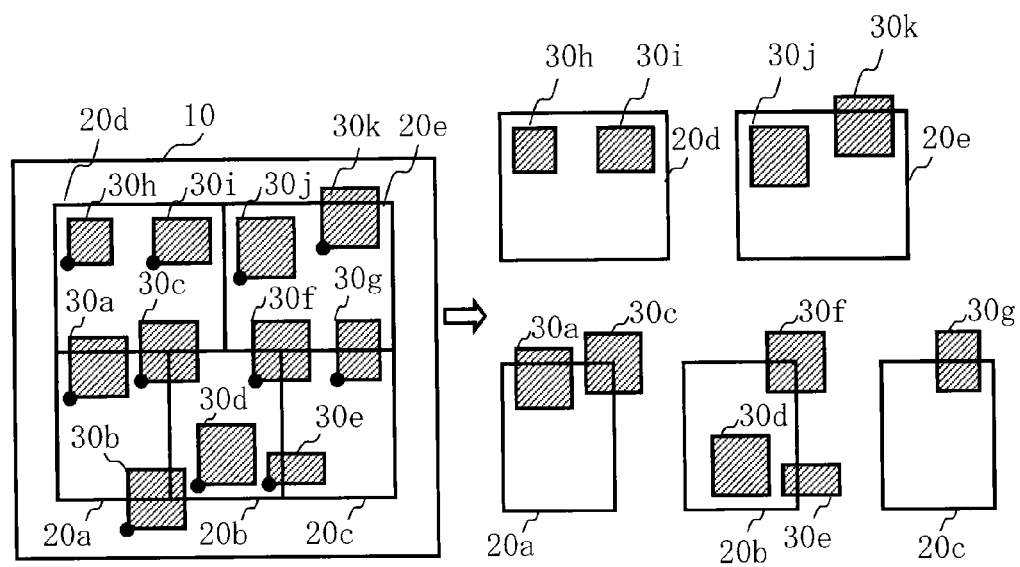
FIGS. 4A and 4B show an example of data processing blocks and cells to be extracted according to Embodiment 1.

FIGS. 4A and 4B show an example of data processing blocks and cells to be extracted in Embodiment 1. The contents of FIG. 4A are the same as those of FIG. 3A. According to Embodiment 1, not all the cells each of which even slightly extends over DPBs are extracted, but, in each DPB, only the cells each of which has its reference position in the DPB concerned are extracted. As the reference position of a cell, for example, it is preferable to use the position of the corner at the lower left as shown in FIG. 4A. Therefore, cells are not extracted redundantly (in other words, a plurality of times), but extracted in only one DPB as shown in FIG. 4B. However, this state makes it difficult to accurately calculate a pattern area density in each DPB. Then, according to Embodiment 1, a pattern area density is accurately calculated by using a circumscribing frame as described below.

In the step (S102) of dividing into data processing blocks (DPBs) (1), the dividing unit 70 divides a chip region into a plurality of data processing blocks (DPBs) (1) (first data processing block) for calculating an area density. The dividing unit 70 is an example of a first dividing unit.

Figure 5:
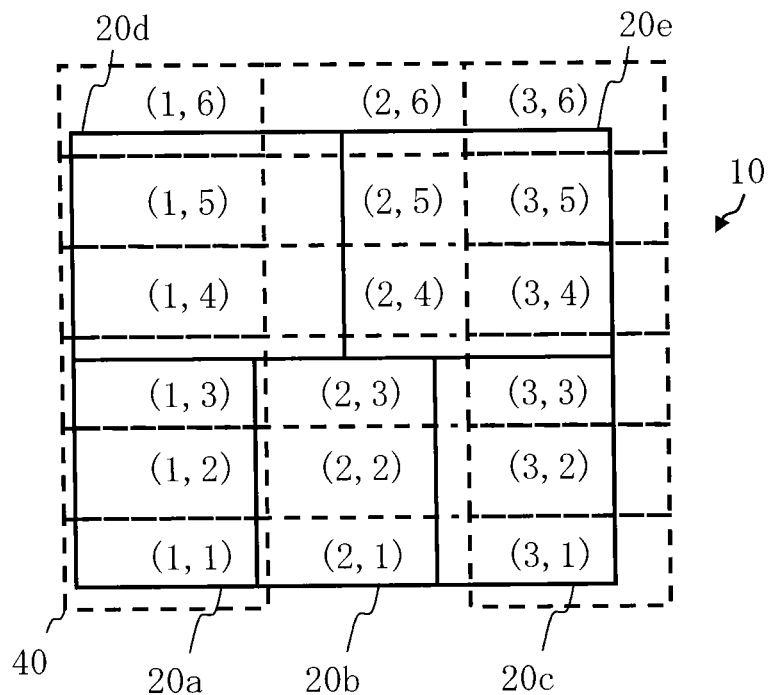
FIG. 5 shows an example of a data processing block for area density calculation and a data processing block for dose calculation according to Embodiment 1.

FIG. 5 shows an example of a data processing block for area density calculation and a data processing block for dose calculation according to Embodiment 1. In FIG. 5, the data processing block (DPB) (1) for area density calculation is divided into blocks such that the number of beam shots in each divided block is approximately equal with each other, for example. If the number of beam shots in each divided block is approximately equal with each other, the time for calculating an area density of each divided block is also approximately equal with each other. The number of beam shots may be estimated in advance for each predetermined mesh region by using a calculator, etc. (not shown). As a data processing block (DPB) (1) for area density calculation, FIG. 5 shows a case of dividing a chip region 10 into a plurality of DPBs 20a to 20e as shown in FIG. 4A, for example.

In the step (S104) of dividing into DPBs (2), the dividing unit 72 divides a chip region into a plurality of data processing blocks (DPBs) (2) for dose calculation. Specifically, the dividing unit 72 divides a chip region into a plurality of data processing blocks (DPBs) (2) (second data processing blocks) which are different from the plurality of data processing blocks (DPBs) (1) for area density calculation (first data processing block). The dividing unit 72 is an example of a second dividing unit. In FIG. 5, a data processing block (DPB) (2) for dose calculation is divided into fixed size blocks. As a DPB (2) for dose calculation, FIG. 5 shows a case of dividing the chip region 10 into a plurality of DPBs 40 represented by coordinates (2, 4) to (3, 6), for example.

In the circumscribing frame (1) generating step (S106), the circumscribing frame generating unit 74 generates, for each DPB (1), a circumscribing frame (second frame) which surrounds a DPB (1) concerned and a maximum cell in the case of the maximum cell of a pre-set maximum size is arranged at the outside of the DPB (1) concerned, such that a reference position is located at a vertex of the DPB (1) concerned. The circumscribing frame generating unit 74 is an example of a second frame generating unit.

Figure 6:
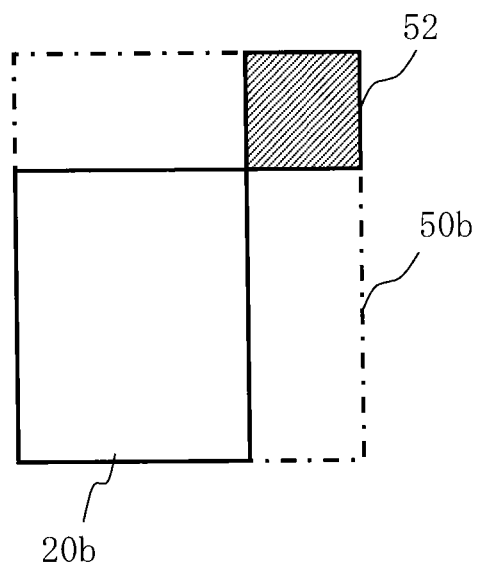
FIG. 6 shows an example of a circumscribing frame generated by using a cell of a maximum cell size according to Embodiment 1.

FIG. 6 shows an example of a circumscribing frame generated by using the cell of the maximum cell size according to Embodiment 1. In FIG. 6, the reference position (for example, the lower left vertex) of a cell 52 of the maximum size is located at the upper right vertex of a certain DPB (1) for area density calculation (for example, DPB 20b). Then, a circumscribing frame 50b is generated such that the DPB 20b and the cell 52 are surrounded by the frame 50b. The circumscribing frame is a quadrangular frame of a minimum size for surrounding a plurality of quadrangles (in this case, the DPB 20b and the cell 52) such that the circumscribing frame contacts outermost sides of the quadrangles. The maximum cell size may be preset in the writing apparatus 100. In addition, with respect to each of the other DPBs, namely 20a and 20c to 20e, the cell 52 is similarly arranged to generate circumscribing frames 50a and 50c to 50e (not shown) for surrounding.

In the associating (1) step (S108), the associating unit 76 associates at least one of a plurality of DPBs (1) with each DPB (2) for dose calculation, based on a circumscribing frame 50 (second frame) generated for each DPB (1) for area density calculation. The associating unit 76 is an example of a second associating unit.

Figure 7:
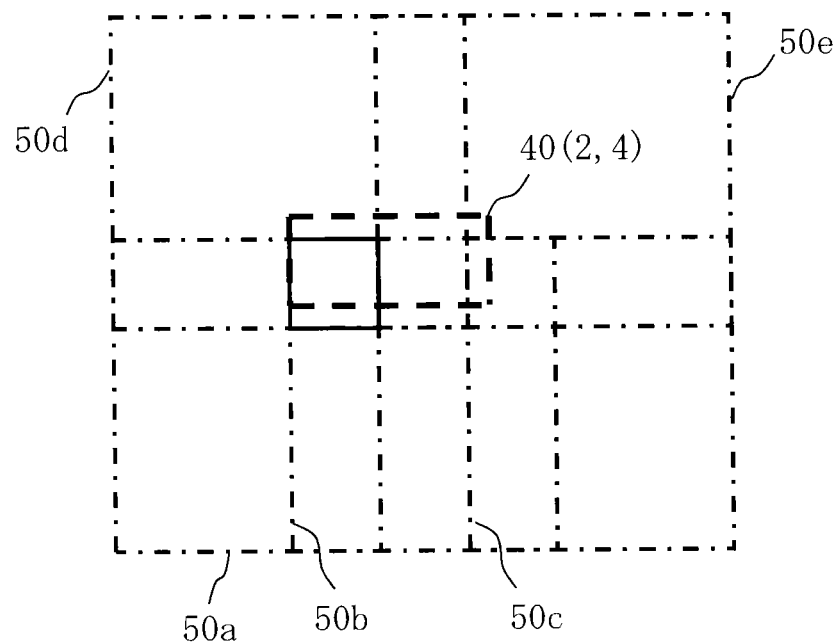
FIG. 7 is a schematic diagram explaining association between a circumscribing frame contactingly surrounding a cell of a maximum size and a data processing block for dose calculation according to Embodiment 1.

FIG. 7 is a schematic diagram explaining association between a circumscribing frame contactingly surrounding a cell of a maximum size and a data processing block for dose calculation according to Embodiment 1. In FIG. 7, a DPB 40 of coordinates (2, 4) is shown as a DPB (2) for dose calculation, for example. The circumscribing frames 50 which even partly overlap with the DPB 40 of coordinates (2, 4) are the circumscribing frame 50a of the DPB 20a, the circumscribing frame 50b of the DPB 20b, the circumscribing frame 50c of the DPB 20c, the circumscribing frame 50d of the DPB 20d, and the circumscribing frame 50e of the DPB 20e. Therefore, in this case, the DPBs 20a to 20e for area density calculation are associated with the DPB 40 of coordinates (2, 4) for dose calculation. Similarly, at least one of the DPBs 20 for area density calculation is associated with each of DPBs 40 of the other coordinates except for coordinates (2, 4).

As described above, the block size of the DPB (1) for area density calculation and that of the DPB (2) for dose calculation are different. For calculating a dose of the DPB (2) for dose calculation, the value of area density of the region where the DPB (2) concerned is located is needed. Therefore, temporary association has been performed here. Through this temporary association, it is possible to know which DPB (1) for area density calculation is necessary, as the maximum size one, for the calculation of the DPB (2) for dose calculation. However, since the association described above is the case of the circumscribing frame for the cell of the maximum size which is arranged at the upper right, although it includes a cell actually extracted, it is larger than needed.

In the cell extracting step (S110), the cell extracting unit 78, for each DPB (1) for area density calculation, extracts a cell whose cell reference position is located in the DPB (1) concerned from a plurality of cells each including at least one figure pattern. As shown in FIG. 4A, in the example of dividing a certain chip region into a plurality of DPBs 20a to 20e, the cells 30a to 30k are arranged in the DPBs 20a to 20e. Specifically, at least a part of the cells 30a, 30b, and 30c are included in the DPB 20a. At least a part of the cells 30b, 30c, 30d, 30e, and 30f are included in the DPB 20b. At least a part of the cells 30e, 30f, and 30g are included in the DPB 20c. At least a part of the cells 30a, 30c, 30h, and 30i are included in the DPB 20d. At least a part of the cells 30f, 30g, 30j, and 30k are included in the DPB 20e. In such a case, according to Embodiment 1, not all the cells each of which even slightly extends over DPBs (1) are extracted, but, in each DPB, only the cells each of which has its reference position in the DPB (1) concerned are extracted as explained in reference to FIG. 4B. As the reference position of a cell, for example, the position of the corner at the lower left is used. Therefore, as shown in FIG. 4B, the cells 30a and 30c are extracted in the DPB 20a. The cells 30d, 30e, and 30f are extracted in the DPB 20b. The cell 30g is extracted in the DPB 20c. The cells 30h and 30i are extracted in the DPB 20d. The cells 30j and 30k are extracted in the DPB 20e. Accordingly, cells are not redundantly (in other words, a plurality times) extracted, but extracted in only one DPB. In addition, the cell 30b is extracted in the DPB (not shown) located below the DPB 20a.

In the circumscribing frame (2) generating step (S112), the circumscribing frame generating unit 80 generates, for each DPB (1) for area density calculation, a circumscribing frame (first frame) which surrounds the DPB (1) concerned and an extracted cell. The circumscribing frame generating unit 80 is an example of a first frame generating unit.

Figure 8:
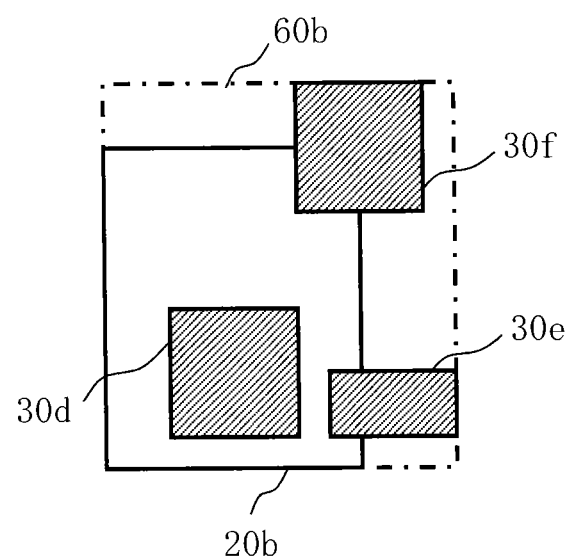
FIG. 8 shows an example of a circumscribing frame generated by using an extracted cell according to Embodiment 1.

FIG. 8 shows an example of a circumscribing frame generated by using an extracted cell according to Embodiment 1. In FIG. 8, the cells 30d, 30e, and 30f are extracted in a certain DPB (1) for area density calculation (for example, the DPB 20b). In the state where the extracted cells 30d, 30e, and 30f are arranged, a circumscribing frame 60b is generated such that it surrounds the DPB 20b, and the cells 30d, 30e, and 30f. The circumscribing frame is a quadrangular frame of a minimum size for surrounding a plurality of quadrangles (in this case, the DPB 20b and the cells 30d, 30e, and 30f) such that the circumscribing frame contacts outermost sides of the plurality of quadrangles. In the example of FIG. 8, the circumscribing frame 60b is in contact with the left and bottom sides of the DPB 20b, the right side of the cell 30e, and the upper side of the cell 30f. Similarly, with respect to the DPBs 20a, and 20c to 20e, circumscribing frames 60a and 60c to 60e (not shown) are generated respectively to surround extracted cells which are similarly arranged.

In the associating (2) step (S114), the associating unit 82 associates at least one of a plurality of DPBs (1) with each DPB (2) for dose calculation, based on a circumscribing frame 60 (first frame) generated for each DPB (1) for area density calculation. Thus, when performing this association, the associating unit 82 re-associates the DPB (1) with each DPB (2) for dose calculation, which has already been associated based on the circumscribing frame 50, based on the circumscribing frame 60. The associating unit 82 is an example of a first associating unit. In this case, since the circumscribing frame is for the actually extracted cell 30, the size of the frame is smaller than the circumscribing frame 50 generated using the cell 52 of the maximum cell size.

Figure 9:
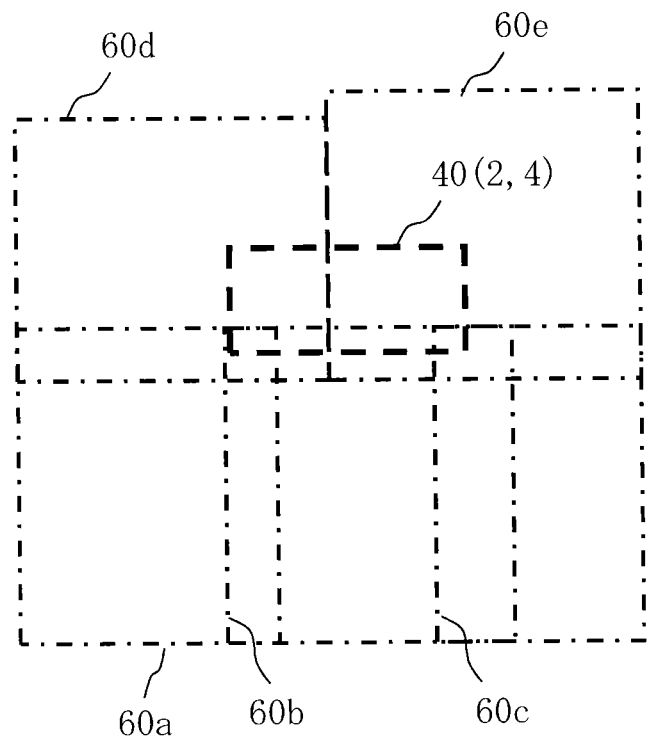
FIG. 9 is a schematic diagram explaining association between a circumscribing frame contactingly surrounding an extracted cell and a data processing block for dose calculation according to Embodiment 1.

FIG. 9 is a schematic diagram explaining association between a circumscribing frame contactingly surrounding an extracted cell and a data processing block for dose calculation according to Embodiment 1. In FIG. 9, the DPB 40 of coordinates (2, 4) is shown as a DPB (2) for dose calculation, for example.

The circumscribing frames 60 which even partly overlap with the DPB 40 of the coordinates (2, 4) are the circumscribing frame 60a of the DPB 20a, the circumscribing frame 60b of the DPB 20b, the circumscribing frame 60c of the DPB 20c, the circumscribing frame 60d of the DPB 20d, and the circumscribing frame 60e of the DPB 20e. Therefore, in this case, the DPBs 20a to 20e for area density calculation are associated with the DPB 40 of the coordinates (2, 4) for dose calculation. Similarly, at least one of the DPBs 20 for area density calculation is associated with each of the DPBs 40 of the other coordinates except for coordinates (2, 4).

Thus, since the association is performed by using the circumscribing frame 60 which is based on an actually extracted cell, the size of the circumscribing frame 60 is smaller than that of the circumscribing frame 50 based on a cell of a maximum cell size. Therefore, in the example of FIG. 9, the same number of association as that of the case using the circumscribing frame 50 has been performed between the DPB 40 of coordinates (2, 4) for dose calculation and the DPBs 20a to 20e for area density calculation. However, with respect to the DPB 40 of the other coordinates, there may be a case where the number of DPBs 20 for area density calculation to be associated can be lessened.

In the step (S116) of dividing into meshes, in each circumscribing frame 60, the dividing unit 84 divides the inside of the circumscribing frame 60 concerned into a plurality of mesh regions.

Figure 10:
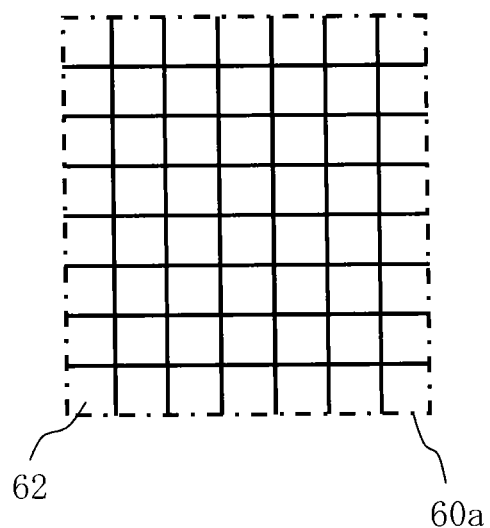
FIG. 10 shows an example of the state in which the inside of a circumscribing frame is divided into mesh regions according to Embodiment 1.

FIG. 10 shows an example of the state in which the inside of a circumscribing frame is divided into mesh regions according to Embodiment 1. FIG. 10 shows the case where the circumscribing frame 60a of the DPB 20a is divided into a plurality of mesh regions 62, for example. Similarly, each of the circumscribing frames 60b to 60e of the DPBs 20b to 20e for area density calculation is also divided into a plurality of mesh regions respectively. It is preferable for a mesh size to be, for example, for performing a proximity effect correction. For example, preferably, it may be about 1/10 of the influence radius of the proximity effect, and specifically, may be about 1 μm. However, the mesh size is not limited to the size for performing proximity effect correction. For example, it may be a size for correcting the fogging effect. Since the influence radius of a fogging effect is several mm, it is preferable for a mesh size for fogging effect to be about 1/10 of the influence radius, for example, 1 mm, for performing correction calculation.

In the area density calculating step (S118), the area density calculating unit 86 calculates, for each circumscribing frame 60a, an area density ρ of a figure pattern located in each mesh region 62. For example, the cells 30a and 30c have been extracted in the DPB 20a. Therefore, the cells 30a and 30c are arranged in the circumscribing frame 60a. Accordingly, the area density ρ of each mesh region 62 is calculated in the state where figure patterns in the cells are arranged in the circumscribing frame 60a. Similarly, with respect to the circumscribing frames 60b to 60e of the DPBs 20b to 20e for area density calculation, the area density ρ of the figure pattern arranged in each mesh region 62 is respectively calculated in order.

Then, for calculating a dose in a DPB 40 of certain coordinates for dose calculation, the area density of an associated DPB (1) is needed. Therefore, it is inevitably necessary to wait until the area density of DPB (1) associated through the circumscribing frame 60 has been completed. Thus, it is desired to perform the area density calculation of the associated DPB (1) at high speed. Since the size of the circumscribing frame 60 is smaller than that of the circumscribing frame 50, the time for calculating the area density ρ in each circumscribing frame 60 is shorter than the case using the circumscribing frame 50.

In the combining step (S120), the combining unit 90 combines an area density ρ and another area density ρ of overlapping mesh regions between several different circumscribing frames 60. The combining unit 90 is an example of an area density combining unit.

Figure 11:
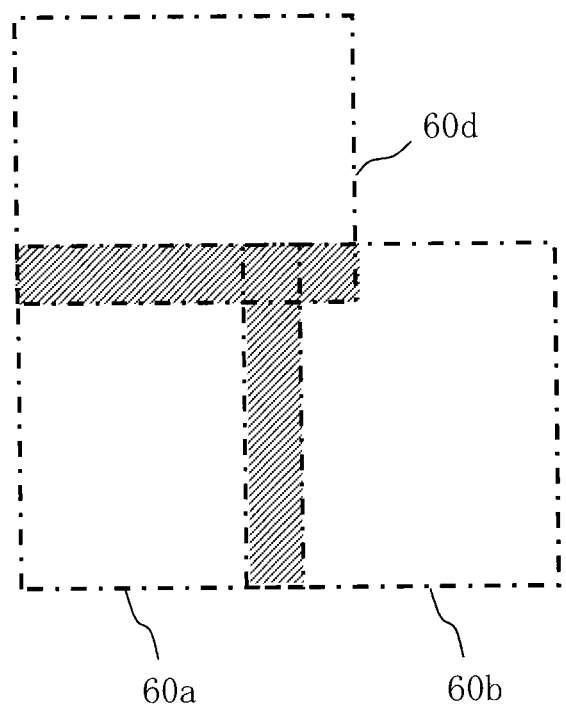
FIG. 11 is a schematic diagram explaining combining area densities of mesh regions of a plurality of circumscribing frames according to Embodiment 1.

FIG. 11 is a schematic diagram explaining combining area densities of mesh regions of a plurality of circumscribing frames according to Embodiment 1. FIG. 11 illustrates an example of an overlapped state of the circumscribing frame 60a of the DPB 20a, the circumscribing frame 60b of the DPB 20b, and the circumscribing frames 60d of the DPB 20d, for example. In FIG. 11, the overlapping portions are shown in hatched lines. In the portion where the circumscribing frames 60 are overlapped with each other, area densities respectively calculated in the overlapping mesh regions are cumulatively added and combined. Thereby, for each mesh region, the area density can be uniquely determined. According to Embodiment 1, in the cell extracting step (S110), not all the cells each of which even slightly extends over DPBs (1) are extracted, but only the cells each of which has its reference position in the DPB (1) concerned are extracted in each DPB (1). Therefore, it can be avoided to redundantly (in other words, a plurality of times) calculate an area density in each mesh region.

Furthermore, since combining is performed for the mesh regions in the overlapping portion by using the circumscribing frames 60, for each DPB (1), it becomes unnecessary to perform affiliation judgment of figure patterns in the DPB (1). Therefore, the calculation time can be reduced by that mount.

In the judging step (S122), for each DPB 40 for dose calculation, the judging unit 92 judges whether calculating the area density of a DPB (1) associated through the circumscribing frame 60 has been completed or not. When the calculation has not been completed yet, it returns to the judging step (S122). When the calculation has already been finished, it goes to a dose calculation.

In the dose calculating step (S124), the dose calculating unit 94 calculates a dose of an electron beam by using a calculated area density. After the area density ρ in at least one DPB (1) associated through the circumscribing frame 60 has been calculated for each DPB (2), the dose calculating unit 94 calculates a dose of the electron beam 200 by using the area density ρ in at least one associated DPB (1). Moreover, by dividing the DPB (2) into mesh regions each having a predetermined size, the dose calculating unit 94 calculates a necessary dose for each mesh region (mesh for dose calculation). The dose can be obtained as a value calculated by multiplying the base dose Dbase by a correction coefficient. As the correction coefficient, for example, it is preferable to use a proximity effect correction coefficient $Dp(\rho)$, which is for correcting a proximity effect. The proximity effect correction coefficient $Dp(\rho)$ is a function depending on the pattern area density ρ of a mesh for a proximity effect. Moreover, when performing fogging effect correction, the dose can be obtained as a value calculated by multiplying the base dose Dbase by a fogging effect correction coefficient $Df(\rho)$. The fogging effect correction coefficient $Df(\rho)$ is a function depending on the pattern area density p of a mesh for fogging effect. In addition, it is also preferable to correct the dose by using a correction coefficient $Dl(\rho)$ for correcting a loading effect. Moreover, it is also preferable to perform correction by multiplying the base dose Dbase by a part or all of the correction coefficients. Also in these corrections, a pattern density in each mesh region for calculation is used. The dose calculating unit 94 generates a dose map in which each calculated dose is defined for each region. The generated dose map is stored in the storage device 142.

In the shot data generating step (S126), the shot data generating unit 96 reads writing data from the storage device 140 and performs data conversion processing of several steps to generate shot data unique to the apparatus. As described above, for writing a figure pattern by the writing apparatus 100, it is necessary to divide each figure pattern defined in the writing data such that a divided figure pattern has a size to be beam-irradiated by one beam shot. Then, for actually performing writing, the shot data generating unit 96 divides each figure pattern to have a size to be irradiated by one beam shot in order to generate a shot figure. Shot data is generated for each shot figure. Writing data, such as a figure type, a figure size, and an irradiation position are defined in each shot data. The generated shot data is stored in the storage device 142.

In the writing step (S128), the control circuit 120 controlled by the writing control unit 98 inputs shot data and a dose map from the storage device 142, and controls the writing unit 150. The writing unit 150 writes a pattern on the target workpiece 101 by irradiating the electron beam 200 so that it may have the calculated dose. Specifically, it operates as described below.

The electron beam 200 emitted from the electron gun 201 (emission unit) irradiates the entire first aperture plate 203 having a quadrangular opening by the illumination lens 202. At this point, the electron beam 200 is shaped to be a quadrangle. Then, after having passed through the first aperture plate 203, the electron beam 200 of a first aperture image is projected onto the second aperture plate 206 by the projection lens 204. The first aperture image on the second aperture plate 206 is deflection-controlled by the deflector 205 so as to change the shape and size of the beam to be variably shaped. After having passed through the second aperture plate 206, the electron beam 200 of a second aperture image is focused by the objective lens 207 and deflected by the main deflector 208 and the sub deflector 209, and reaches a desired position on the target workpiece 101 on the XY stage 105 which moves continuously. FIG. 1 shows the case of using a multiple stage deflection, namely the two stage deflector of the main and sub deflectors, for deflecting a position. In such a case, what is needed is to deflect the electron beam 200 of a shot concerned to the reference position of a subfield (SF), which is made by further dividing the stripe region virtually, by the main deflector 208 while following the stage movement, and to deflect the beam of the shot concerned to each irradiation position in the SF by the sub deflector 209.

As described above, according to Embodiment 1, in the cell extracting step (S110), not all the cells each of which even slightly extends over DPBs (1) are extracted, but, in each DPB (1), only the cells each of which has its reference position in the DPB (1) concerned are extracted. Thus, it can be avoided to redundantly (in other words, a plurality of times) calculate an area density in each mesh region. Furthermore, by performing combining for the mesh region of the overlapping portion by using the circumscribing frame 60, it becomes unnecessary that affiliation judgment of figure patterns in the DPB (1) concerned is performed in each DPB (1). Therefore, the calculation time can be reduced by that mount. Accordingly, the calculation time up to calculating a pattern area density ρ in a DPB (1) (data processing block) can be shortened. As a result, the total writing time including subsequent writing processing can be reduced.

Embodiment 2

In Embodiment 1, the temporary association is performed using the circumscribing frame 50, and however, it is not limited thereto. In Embodiment 2, there will be described a structure for performing temporary association by a further simplified method. The structure of the writing apparatus 100 in Embodiment 2 is the same as that of FIG. 1.

Figure 12:
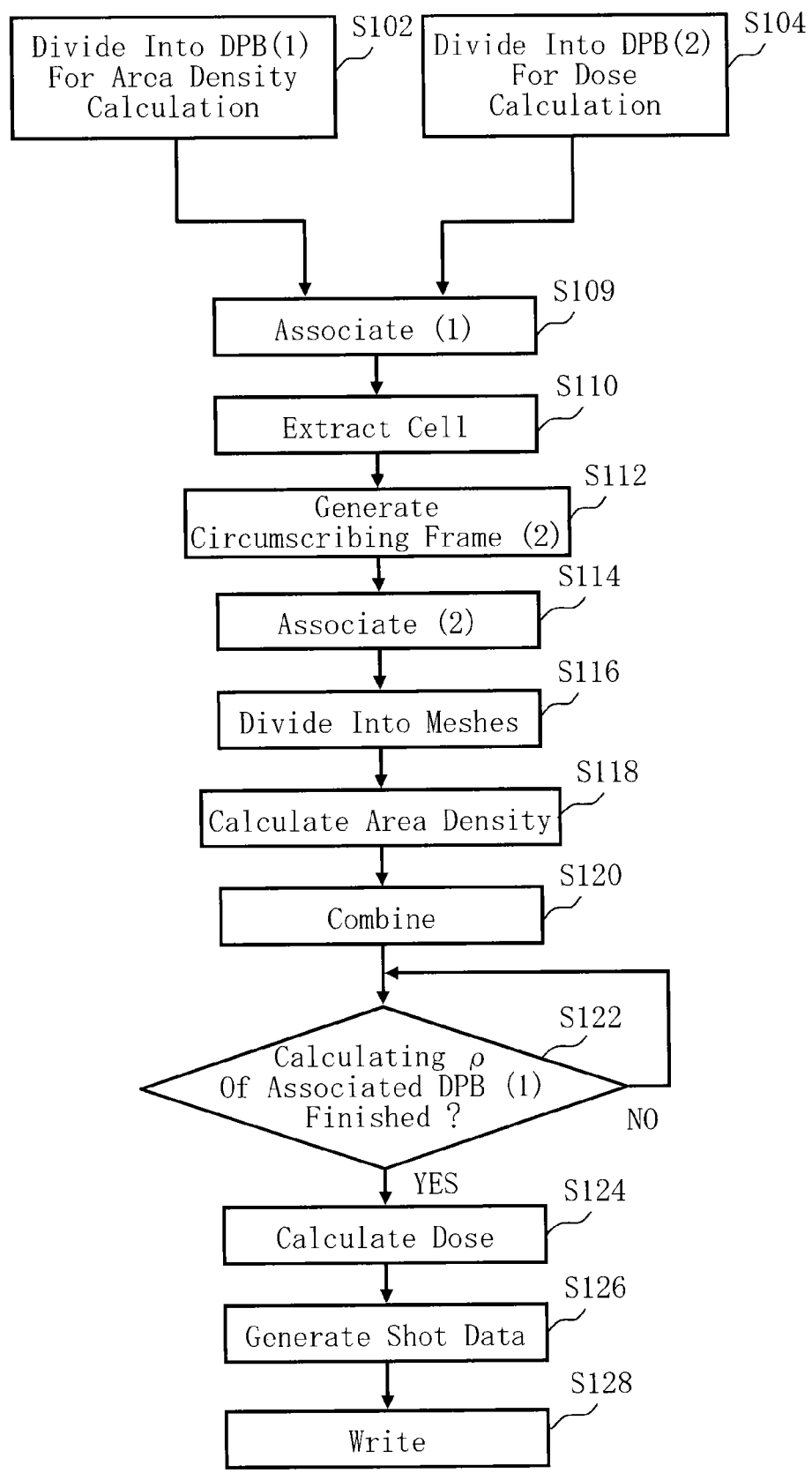
FIG. 12 is a flowchart showing main steps of a writing method according to Embodiment 2.

FIG. 12 is a flowchart showing main steps of a writing method according to Embodiment 2. FIG. 12 is the same as FIG. 2 except for that the circumscribing frame (1) generating step (S106) is removed and an associating (1) step (S109) is added instead of the associating (1) step (S108). Hereafter, the contents except for the point particularly described are the same as those of Embodiment 1.

In the associating (1) step (S109), in each DPB (2) (second data processing block), when the writing direction is from the left to the right toward a DPB (2) concerned, the associating unit 76 associates all the DPBs (1) (first data processing blocks) whose lower left vertices are located lower left of the upper right vertex of the DPB (2) with the DPB (2) concerned, and when the writing direction is from the right to the left, associates all the DPBs (1) whose lower right vertices are located lower right of the upper left vertex of the DPB (2) with the DPB (2) concerned. The associating unit 76 is an example of a second associating unit.

Figure 13:
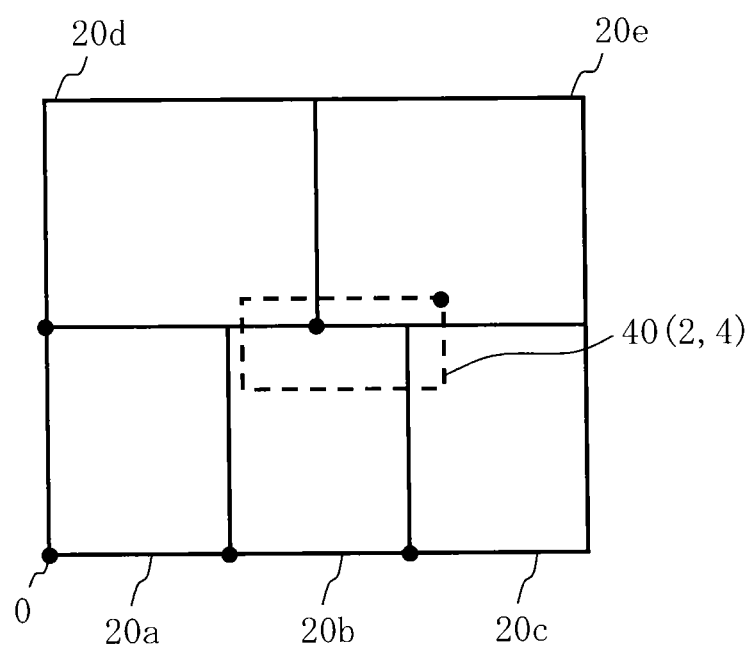
FIG. 13 is a schematic diagram explaining a method of associating according to Embodiment 2.
Figure 14:
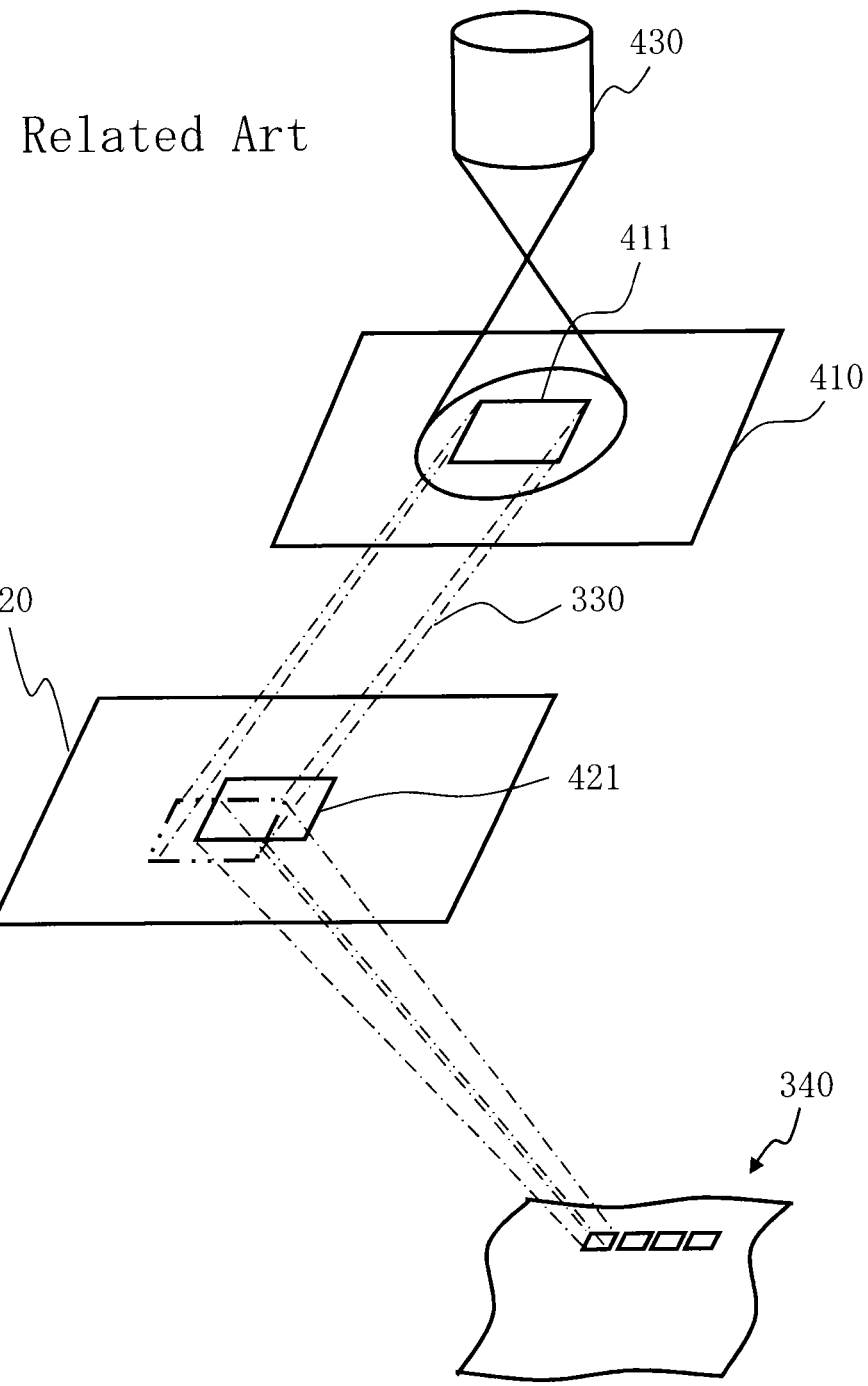
FIG. 14 is a schematic diagram explaining operations of a variable-shaped electron beam writing apparatus.

FIG. 13 is a schematic diagram explaining a method of associating according to Embodiment 2. In FIG. 13, a DPB 40 of coordinates (2, 4) is shown as a DPB (2) for dose calculation, for example. When the writing direction is from the left to the right in the chip region, the DPBs 20a, 20b, 20c, 20d and 20e whose lower left vertices are located lower left of the upper right vertex of the DPB 40 of the coordinates (2, 4) are associated with the DPB 40 of the coordinates (2, 4). By this way, it is possible to associate all the DPBs (1) each of which even slightly overlaps with the DPB 40 of the coordinates (2, 4). In addition, in the DPB 20a, since it is assumed that a cell to be extracted later protrudes toward upper right, it is desirable to be associated. If the writing direction is from the right to the left in the chip region, the DPBs 20b, 20c, 20d and 20e whose lower right vertices are located lower right of the upper left vertex of the DPB 40 of the coordinates (2, 4) are associated with the DPB 40 of the coordinates (2, 4).

The contents of from the cell extracting step (S110) to the circumscribing frame (2) generating step (S112) are the same as those of Embodiment 1.

In the associating (2) step (S114), the associating unit 82 associates at least one of a plurality of DPBs (1) with each DPB (2) for dose calculation, based on a circumscribing frame 60 (first frame) generated for each DPB (1) for area density calculation. Thus, when the writing direction is from the left to the right toward a DPB (2) concerned, the associating unit 82 performs re-associating for each DPB (2) with which all the DPBs (1) whose lower left vertices are located lower left of the upper right vertex of the DPB (2) concerned are associated, based on the circumscribing frame 60. When the writing direction is from the right to the left toward a DPB (2) concerned, the associating unit 82 performs re-associating for each DPB (2) with which all the DPBs (1) whose lower right vertices are located lower right of the upper left vertex of the DPB (2) concerned are associated, based on the circumscribing frame 60. Subsequent steps are the same as those of Embodiment 1.

As described above, according to Embodiment 2, it is possible to perform associating at the vertex position of the DPB (1) without generating the temporary circumscribing frame 50.

Therefore, step processing with respect to the temporary circumscribing frame 50 becomes unnecessary, thereby reducing the data processing time further than Embodiment 1. Accordingly, the calculation time up to calculating a pattern area density $\rho$ in a DPB (1) can be shorter than that of Embodiment 1. As a result, the total writing time including subsequent writing processing can be reduced.

Referring to specific examples, Embodiments have been described above. However, the present invention is not limited to these examples.

While the apparatus structure, control method, etc. not directly necessary for explaining the present invention are not described, some or all of them may be suitably selected and used when needed. For example, although description of the structure of a controlling unit for controlling the writing apparatus 100 is omitted, it should be understood that some or all of the structure of the controlling unit is to be selected and used appropriately when necessary.

In addition, any other charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a first dividing unit configured to divide a chip region into a plurality of first data processing blocks;
a cell extracting unit configured to, in each of the plurality of first data processing blocks, extract a cell whose reference position is located in a first data processing block concerned from a plurality of cells each including at least one figure pattern;
a first frame generating unit configured to, for each of the plurality of first data processing blocks, generate a first frame that surrounds the first data processing block concerned and the cell extracted, wherein a portion of at least one first frame for each of the plurality of first data processing blocks overlaps with a portion of at least another first frame for another first data processing block adjacent to each of the plurality of first data processing blocks;
an area density calculating unit configured to, for each first frame, divide an inside of the first frame concerned into a plurality of mesh regions, and calculate an area density of a figure pattern arranged in each of the plurality of mesh regions;
an area density combining unit configured to combine an area density of one mesh region of the plurality of mesh regions of one first frame and an area density of another mesh region of the plurality of mesh regions of another first frame, where the one and the another mesh regions overlap each other and are included in plural first frames;
a dose calculating unit configured to calculate a dose of a charged particle beam by using an area density combined; and a writing unit configured to write a pattern on a target workpiece by irradiating the charged particle beam such that the charged particle beam has the dose calculated.

2. The apparatus according to claim 1 further comprising:
a second dividing unit configured to divide the chip region into a plurality of second data processing blocks different from the plurality of first data processing blocks; and
a first associating unit configured to associate at least one of the plurality of first data processing blocks with each of the plurality of second data processing blocks, based on the first frame generated for each of the plurality of first data processing blocks,
wherein the dose calculating unit calculates a dose of the charged particle beam by using the area density in the at least one associated first data processing blocks, after an area density in at least one associated first data processing block is calculated, for each of the plurality of second data processing blocks.

3. The apparatus according to claim 2 further comprising:
a second frame generating unit configured to, for each of the plurality of first data processing blocks, generate a second frame that surrounds a first data processing block concerned and a maximum cell when the maximum cell of a pre-set maximum size is arranged at an outside of the first data processing block concerned such that the reference position is located at one of vertices of the first data processing block concerned; and
a second associating unit configured to associate at least one of the plurality of first data processing blocks with each of the plurality of second data processing blocks, based on the second frame generated for each of the plurality of first data processing blocks,
wherein the second associating unit is configured to perform the association before the first associating unit performs the association, and
the first associating unit performs re-association, based on the first frame, for each second data processing block which has been associated based on the second frame, when the first associating unit performs the association.

4. The apparatus according to claim 2, further comprising:
a second associating unit configured to, for each the plurality of second data processing blocks, when a writing direction is from left to right toward a second data processing block concerned, associate the second data processing block concerned with all first data processing blocks whose lower left vertices are located lower left of an upper right vertex of the second data processing block concerned, and when the writing direction is from the right to the left, associate the second data processing block concerned with all first data processing blocks whose lower right vertices are located lower right of an upper left vertex of the second data processing block concerned,
wherein the second associating unit is configured to perform the association before the first associating unit performs the asociation, and
the first associating unit performs re-association concerning the first data processing block, based on the first frame, for each second data processing block which has been associated with all first data processing blocks whose lower left vertices are located lower left of the upper right vertex of the second data processing block concerned when the writing direction is from the left to the right toward the second data processing block concerned, and performs the re-association, based on the first frame, for each second data processing block which has been associated with all first data processing blocks whose lower right vertices are located lower right of the upper left vertex of the second data processing block concerned when the writing direction is from the right to the left toward the second data processing block concerned.

5. The apparatus according to claim 2,
wherein the plurality of first data processing blocks are divided such that a number of beam shots in each divided first data processing block is approximately equal.

6. The apparatus according to claim 5,
wherein the plurality of second data processing blocks are divided to each have a fixed size.

7. The apparatus according to claim 3,
wherein the second frame is a quadrangular frame of a minimum size for surrounding a perimeter of the first data processing block and a perimeter of a maximum cell such that the second frame contactingly surrounds outermost sides of the perimeter of the first data processing block and the perimeter of the maximum cell.

8. The apparatus according to claim 3,
wherein the first frame is a quadrangular frame of a minimum size for surrounding a perimeter of the first data processing block and a perimeter of the cell extracted such that the first frame contactingly surrounds outermost sides of the perimeter of the first data processing block and the perimeter of the cell extracted.

9. The apparatus according to claim 1,
wherein the dose calculating unit calculates the dose by multiplying a base dose by a proximity effect correction coefficient depending on the area density of the figure pattern.

10. The apparatus according to claim 1,
wherein, when there exists a cell extending over first data processing blocks, the cell extracting unit extracts the cell for one of the plurality of first data processing blocks, and thus does not extract the cell for other first data processing blocks over which the cell extends.

11. The apparatus according to claim 3,
wherein the first frame is smaller than the second frame corresponding to the first frame.

12. A charged particle beam writing method comprising:
dividing a chip region into a plurality of first data processing blocks;
extracting, in each of the plurality of first data processing blocks, a cell whose reference position is located in a first data processing block concerned from a plurality of cells each including at least one figure pattern;
generating, for each of the plurality of first data processing blocks, a first frame that surrounds the first data processing block concerned and the cell extracted, wherein a portion of at least one first frame for each of the plurality of first data processing blocks overlaps with a portion of at least another first frame for another first data processing block adjacent to each of the plurality of first data processing blocks;
dividing, for each the first frame, an inside of the first frame concerned into a plurality of mesh regions, and calculating an area density of a figure pattern arranged in each of the plurality of mesh regions;
combining an area density of one mesh region of the plurality of mesh regions of one first frame and an area density of another mesh region of the plurality of mesh regions of another first frame, where the one and the another mesh regions overlap each other and are included in plural first frames;
calculating a dose of a charged particle beam by using an area density combined; and writing a pattern on a target workpiece by irradiating the charged particle beam such that the charged particle beam has the dose calculated.

13. The method according to claim 12, further comprising:
dividing the chip region into a plurality of second data processing blocks different from the plurality of first data processing blocks; and
associating at least one of the plurality of first data processing blocks with each of the plurality of second data processing blocks, based on the first frame generated for each of the plurality of first data processing blocks,
wherein, for each of the plurality of second data processing blocks, after an area density in at least one associated first data processing block is calculated, a dose of the charged particle beam is calculated by using the area density in the at least one associated first data processing blocks.

14. The method according to claim 13, further comprising:
generating, for each of the plurality of first data processing blocks, a second frame that surrounds a first data processing block concerned and a maximum cell when the maximum cell of a pre-set maximum size is arranged at an outside of the first data processing block concerned such that the reference position is located at one of vertices of the first data processing block concerned; and
associating at least one of the plurality of first data processing blocks with each of the plurality of second data processing blocks, based on the second frame generated for each of the plurality of first data processing blocks,
wherein the associating based on the second frame is performed before the associating based on the first frame, and
re-association is performed based on the first frame, for each second data processing block which has been associated based on the second frame, in the associating based on the first frame.

15. The method according to claim 14, further comprising:
associating, for each of the plurality of second data processing blocks, a second data processing block concerned with all first data processing blocks whose lower left vertices are located lower left of an upper right vertex of the second data processing block concerned when a writing direction is from left to right toward the second data processing block concerned, and associating the second data processing block concerned with all first data processing blocks whose lower right vertices are located lower right of an upper left vertex of the second data processing block concerned when the writing direction is from the right to the left,
wherein the associating based on the second frame is performed before the associating based on the first frame, and
when performing the associating for each of the plurality of second data processing blocks, re-association concerning the first data processing block is performed based on the first frame, for each second data processing block which has been associated with all first data processing blocks whose lower left vertices are located lower left of the upper right vertex of the second data processing block concerned when the writing direction is from the left to the right toward the second data processing block concerned, and the re-association is performed based on the first frame, for each second data processing block which has been associated with all first data processing blocks whose lower right vertices are located lower right of the upper left vertex of the second data processing block concerned when the writing direction is from the right to the left toward the second data processing block concerned.

16. The method according to claim 13,
wherein the plurality of first data processing blocks are divided such that a number of beam shots in each divided first data processing block is approximately equal.

17. The method according to claim 16,
wherein the plurality of second data processing blocks are divided to each have a fixed size.

18. The method according to claim 14,
wherein the second frame is a quadrangular frame of a minimum size for surrounding a perimeter of the first data processing block and a perimeter of a maximum cell such that the second frame contactingly surrounds outermost sides of the perimeter of the first data processing block and the perimeter of the maximum cell.

19. The method according to claim 14,
wherein the first frame is a quadrangular frame of a minimum size for surrounding a perimeter of the first data processing block and a perimeter of the cell extracted such that the first frame contactingly surrounds outermost sides of the perimeter of the first data processing block and the perimeter of the cell extracted.

* * * * *